(12) United States Patent  (10) Patent No.: US 7,935,951 B2
Czubatyj et al.  (45) Date of Patent: May 3, 2011

(54) COMPOSITE CHALCOGENIDE MATERIALS AND DEVICES

(75) Inventors: Wolodymyr Czubatyj, Warren, MI (US); Sergey Kostylev, Bloomfield Hills, MI (US); Tyler Lowrey, West Augusta, VA (US)

(73) Assignee: Ovonyx, Inc., Troy, MI (US)

( * ) Notice: Subject to any disclaimer, the term of this patent is extended or adjusted under 35 U.S.C. 154(b) by 813 days.

(21) Appl. No.: 11/874,719

(22) Filed: Oct. 18, 2007

(65) Prior Publication Data

US 2008/0035907 A1  Feb. 14, 2008

Related U.S. Application Data

(63) Continuation-in-part of application No. 10/190,858, filed on Jul. 8, 2002, now abandoned, which is a continuation-in-part of application No. 08/739,080, filed on Oct. 28, 1996, now Pat. No. 5,825,046.

(51) Int. Cl.
  *H01L 47/00* (2006.01)
(52) U.S. Cl. ............................... 257/4; 257/2
(58) Field of Classification Search .......... 257/1–5, 257/E45.002
  See application file for complete search history.

(56) References Cited

U.S. PATENT DOCUMENTS

| 3,271,591 A | 9/1966 | Ovshinsky |
| 3,530,441 A | 9/1970 | Ovshinsky |
| 3,715,634 A | 2/1973 | Ovshinsky |
| 4,653,024 A * | 3/1987 | Young et al. ............ 257/2 |
| 5,166,758 A | 11/1992 | Ovshinsky et al. |
| 5,296,716 A | 3/1994 | Ovshinsky et al. |
| 5,536,947 A | 7/1996 | Klersy et al. |
| 5,543,737 A | 8/1996 | Ovshinsky |
| 5,596,522 A | 1/1997 | Ovshinsky et al. |
| 5,687,112 A | 11/1997 | Ovshinsky |
| 5,694,146 A | 12/1997 | Ovshinsky et al. |
| 5,714,768 A | 2/1998 | Ovshinsky et al. |
| 5,757,446 A | 5/1998 | Ovshinsky et al. |
| 5,825,046 A | 10/1998 | Czubatyj et al. |
| 5,912,839 A | 6/1999 | Ovshinsky et al. |
| 6,087,674 A | 7/2000 | Ovshinsky et al. |
| 6,314,014 B1 | 11/2001 | Lowrey et al. |
| 6,671,710 B2 | 12/2003 | Ovshinsky et al. |
| 6,687,153 B2 | 2/2004 | Lowrey |
| 6,714,954 B2 | 3/2004 | Ovshinsky et al. |
| 6,774,387 B2 | 8/2004 | Maimon |
| 6,795,338 B2 | 9/2004 | Parkinson et al. |
| 6,859,390 B2 | 2/2005 | Pashmakov |
| 7,589,364 B2 | 9/2009 | Asano et al. |
| 2002/0017701 A1 | 2/2002 | Klersy et al. |
| 2002/0045323 A1 | 4/2002 | Lowrey et al. |
| 2003/0071289 A1 | 4/2003 | Hudgens et al. |
| 2004/0012008 A1 | 1/2004 | Chen |
| 2004/0245517 A1 | 12/2004 | Campbell |
| 2005/0127348 A1 | 6/2005 | Horak et al. |
| 2005/0173691 A1 | 8/2005 | Lee et al. |
| 2007/0034849 A1 | 2/2007 | Sandoval et al. |
| 2007/0034850 A1 | 2/2007 | Kostylev et al. |
| 2007/0034851 A1 | 2/2007 | Kostylev et al. |
| 2008/0042119 A1 * | 2/2008 | Sandoval et al. ............ 257/4 |
| 2009/0057642 A1 | 3/2009 | Sargent et al. |
| 2009/0095949 A1 | 4/2009 | Kostylev et al. |
| 2009/0095951 A1 | 4/2009 | Kostylev et al. |

* cited by examiner

*Primary Examiner* — Cuong Q Nguyen
(74) *Attorney, Agent, or Firm* — Honigman Miller Schwartz and Cohn LLP (57) ABSTRACT

An electrical device includes a composite switching material. The composite switching material includes an electrically switchable component and a non-switchable component. In one embodiment, the composite switching material includes a heterogeneous mixture of at least one chalcogenide material and at least one dielectric material. The composite switching material is disposed between two electrodes and the switchable component is transformable from a resistive state to a conductive state upon application of a voltage between the two electrodes, without changing phase.

23 Claims, 6 Drawing Sheets

COMPOSITE CHALCOGENIDE MATERIALS AND DEVICES

RELATED APPLICATIONS

The present application is a continuation in part of abandoned U.S. Reissue application Ser. No. 10/190,858, titled "MEMORY ELEMENT WITH MEMORY MATERIAL COMPRISING PHASE-CHANGE MATERIAL AND DIELECTRIC MATERIAL," filed on Jul. 8, 2002, being a Reissue of application Ser. No. 09/063,174, titled "MEMORY ELEMENT WITH MEMORY MATERIAL COMPRISING PHASE-CHANGE MATERIAL AND DIELECTRIC MATERIAL," filed on Apr. 20, 1998, which is now issued as U.S. Pat. No. 6,087,674, which is also a continuation in part of U.S. application Ser. No. 08/739,080, titled "MEMORY ELEMENT WITH MEMORY MATERIAL COMPRISING PHASE-CHANGE MATERIAL AND DIELECTRIC MATERIAL," filed on Oct. 28, 1996, which is now issued as U.S. Pat. No. 5,825,046, wherein the contents of the above mentioned applications are hereby incorporated by reference in their entirety.

TECHNICAL FIELD

The embodiments described herein are generally directed to electrical devices including a composite switching material. More particularly, the invention is related to electrical devices including a composite chalcogenide switching material.

BACKGROUND

Chalcogenide switching devices are used, for example, with phase-change memory devices as an access element. The phase-change non-volatile memory devices are beneficial in applications where data must be retained when power is disconnected. Applications include general memory cards, consumer electronics (e.g., digital camera memory), automotive (e.g., electronic odometers), and industrial applications (e.g., electronic valve parameter storage). The non-volatile memories may use phase-change memory materials, i.e., materials that can be switched between a generally amorphous and a generally crystalline state, for electronic memory applications. The memory of such devices typically comprises an array of memory elements, each element defining a discrete memory location and having a volume of phase-change memory material associated with it. The structure of each memory element typically comprises a phase-change material, one or more electrodes, and one or more dielectrics.

One type of memory element originally developed by Energy Conversion Devices, Inc. utilizes a phase-change material that can be, in one application, switched between a structural state of generally amorphous and generally crystalline local order or between different detectable states of local order across the entire spectrum between completely amorphous and completely crystalline states. These different structural states have different values of resistivity, and therefore each state can be determined by electrical sensing. Typical phase-change materials suitable for memory application include those incorporating one or more chalcogen or pnictogen elements. Unlike certain known devices, these electrical memory devices typically do not use field-effect transistor devices as the memory storage element. Rather, they comprise, in the electrical context, a monolithic body of thin film chalcogenide material. As a result, very little area is required to store a bit of information, thereby providing for inherently high-density memory chips.

Ovonic unified or phase-change memories are an emerging type of electrically-alterable non-volatile semiconductor memories. These memories exploit the properties of materials (phase-change materials) that can be reversibly switched between two or more structural states that vary in the relative proportions of amorphous and crystalline phase regions when subjected to heat or other forms of energy. The term "amorphous" refers to a condition which is relatively structurally less ordered or more disordered than a single crystal and has a detectable characteristic, such as high electrical resistivity. The term "crystalline" as used herein refers to a condition which is relatively structurally more ordered than amorphous and has at least one detectably different characteristic, such as a lower electrical resistivity.

The distinct structural states of a phase-change material exhibit different electrical characteristics, such as resistivity, that can be used to distinguish the different states. Memory or logic functionality is achieved by associating a different memory or logic value with each structural state. Programming occurs by providing the energy needed to stabilize the structural state of the phase-change material associated with the input memory or logic data.

Typically, a memory array includes a matrix of phase-change memory cells, arranged in rows and columns with associated word lines and bit lines, respectively. Each memory cell typically consists of a phase-change storage element connected in series to an access element, where each memory cell is connected between a particular word line and a particular bit line of the array. Each memory cell can be programmed to a particular memory state by selecting the word line and bit line associated with the memory cell and providing a suitable energy pulse across the memory cell. The energy pulse is typically a current pulse applied to the memory cell by supplying a voltage potential between the word line and bit line of the cell. The voltage potential activates the access element connected to the memory element, thereby enabling the flow of current through the memory element. Typical access elements include diodes and transistors. Reading of the memory state is accomplished by similarly selecting the word line and bit line of the memory cell and measuring the resistance (or a proxy therefor (such as the voltage drop across the cell). In order to maintain the state of the memory cell during read, it is necessary to maintain the energy of the read signal at a level below that needed to transform the memory cell from its existing state to a different state.

In addition to memory elements, switching elements, particularly fast switching devices, are desirable for a number of applications. Fast switching elements are capable of being switched between a relatively resistive state and a relatively conductive state and are useful as voltage clamping devices, surge suppression devices, and signal routing devices. Fast switching elements can also be used as access devices in memory arrays.

An important class of fast switching materials are the Ovonic Threshold Switch ("OTS") materials. OTS materials, like many phase-change memory materials, typically include one or more chalcogen elements. Unlike phase-change memory materials, however, the compositions of OTS materials are such that no change in structural state occurs within the range of normal operation of the material. Instead, the OTS material retains an overall predominantly amorphous structure during operation. Application of a suitable energy signal, typically an electrical energy signal having a voltage above a critical threshold level, induces a change of the electrical characteristics of the OTS device from a relatively resistive quiescent off state to a relatively conductive on state. The relatively conductive state persists for so long as the current passing through the OTS material remains above a critical holding level. Once the energy signal is removed or the current otherwise decreases below the level needed to sustain the relatively conductive on state, the OTS material relaxes back to its relatively resistive quiescent off state.

Under one theory of operation, an OTS material achieves its conductive on state through the formation of a localized, conductive filamentary region that extends across the material between opposing electrical contacts when the voltage applied between the contacts is at or above a threshold voltage. When the current across the material is decreased to below the holding level needed to sustain the conductive state, the filamentary region collapses and the material switches back to its resistive quiescent state. As the material is switched between its resistive and conductive states over multiple cycles of operation, the filamentary region is repeatedly formed and extinguished.

A consequence of this mechanism of operation is that the reproducibility and stability of the switching event over multiple cycles of operation depends on the consistency of the characteristics of the localized filament. Optimal performance requires consistent physical placement of the filament within the OTS material and a reproducible threshold voltage to insure control over initiation of the switching event. It is also necessary for the holding current to remain stable over multiple cycles of operation. In practice, it has been observed that the threshold voltage, holding current, and/or physical placement of the filamentary region of OTS materials may vary upon cycling and the switching characteristics of OTS materials is accordingly compromised.

One strategy for stabilizing the operation of OTS materials is to enlarge the lateral dimensions of the material in the switching device and use large area contacts. This approach tolerates variations in the physical location of the filament upon cycling by insuring the existence of an adequate voltage for switching over a range of positions within the material. As a result, any variability in the stabilized position of the filament that may occur upon repeated cycling is accommodated and the possibility of a failure to switch is minimized. The drawback to this approach, however, is that large area contacts increase the energy required to sustain the off state by facilitating leakage of current through non-switched OTS devices leading to high standby current in product applications. Large area devices are further contrary to the general goal of increasing device density in order to reduce cost.

There is accordingly a need for switching devices that utilize small area contacts (to reduce the energy required to sustain the off state), while providing for consistent switching performance over multiple cycles of operation.

SUMMARY

An electrical switching device includes a composite material. The composite material includes a heterogeneous mixture of at least one chalcogenide material and at least one dielectric material. The electrical device may further include a first electrode in electrical communication with the composite switching material and a second electrode in electrical communication with the composite switching material.

In an alternative embodiment, an electrical device includes a lower electrode, a lower insulator above the first electrode and a $2^{nd}$ lower electrode through said lower insulator and in electrical communication with the lower electrode. The electrical device further includes a composite switching material in electrical communication with the $2^{nd}$ lower electrode and an upper electrode in electrical communication with the composite switching material.

In addition to use as a switching device, applications of the composite switching device include use as an access element for memory cells in a phase-change electrical memory array.

Further, a method of making an electrical device is disclosed. The steps include depositing a lower electrode and co-depositing at least one chalcogen element and at least one dielectric material. An upper electrode is also deposited.

BRIEF DESCRIPTION OF THE DRAWINGS

The features and inventive aspects will become more apparent upon reading the following detailed description, claims, and drawings, of which the following is a brief description:

DETAILED DESCRIPTION

Referring now to the drawings, illustrative embodiments are shown in detail. Although the drawings represent the embodiments, the drawings are not necessarily to scale and certain features may be exaggerated to better illustrate and explain novel aspects of an embodiment. Further, the embodiments described herein are not intended to be exhaustive or otherwise limit or restrict the claims to the precise form and configuration shown in the drawings and disclosed in the following detailed description.

A composite switching device is described in detail herein. The composite switching device includes a composite switching material disposed between two or more electrodes and otherwise insulated from surrounding structures. The composite switching material includes an active switching material interspersed with an electrically inert or non-switchable material in the operable region between the electrodes of the device. The active switching material can be switched between two or more states that differ in resistivity. In one embodiment, the active switching material is switchable from a relatively resistive state to a relatively conductive state without undergoing a change in phase. Representative active switching materials include chalcogenide materials and OTS materials. The non-switchable component of the composite switching material is typically a dielectric material. The scope of the instant invention extends to electrical switching devices having the full range of relative proportions of the active switching material and non-switchable material within the volume of the operable portion of the device between the electrodes.

When a dielectric material is introduced with a chalcogenide switching material to form a composite switching material, the operational parameters of the switching event are stabilized relative to corresponding devices that include a homogenous chalcogenide switching material without a non-switchable component in the region between the electrodes of the device. Stabilization of the switching parameters is accomplished at least in part because the dielectric material in the composite chalcogenide material is mechanically harder than the chalcogenide switching material. The high mechanical strength of the dielectric renders it less susceptible to mechanical deformation during operation and cycling of the device. The dielectric material thus rigidly confines the physical location of the chalcogenide switching material within the device and minimizes the tendency for physical motion, rearrangement, or positional variation of the chalcogenide switching material during operation and cycling of the device. The resulting stabilization of the chalcogenide switching material allows for improved repeatability and stability of the threshold voltage ($V_{th}$), threshold current ($I_{th}$), holding voltage ($V_h$), and/or holding current ($I_h$) of the device.

The composite chalcogenide switching material provides reduction of leakage current because the presence of the dielectric reduces the availability of alternative pathways to current flow due to its high resistivity. When a voltage is applied across the electrodes in electrical communication with a composite chalcogenide switching material, the low resistivity of the chalcogenide material when in the conductive state relative to the dielectric material insures that current flow will occur primarily through the chalcogenide. The high resistivity of the dielectric component of the composite switching material inhibits conduction and current flows in pathways around the dielectric component. The available current pathways in the operable region between opposing electrodes are thus largely defined by the physical location and distribution of the chalcogenide component of the composite switching material. The net result is a localized and reproducible channeling of current through the chalcogenide component. For the case of the OTS device in the resistive state, leakage current is minimized and the required energy of operation during standby or active operation is reduced and greater efficiency is achieved. Because of the more rigid confinement of the switchable component by the dielectric, the filamentary region formed in embodiments of switchable materials that progress from a resistive state to a conductive state through the formation of a filament is better localized and more consistently formed in the same physical location over multiple cycles of operation. This leads to greater stabilization and reproducibility of operating parameters such as threshold voltage and holding current.

Inclusion of the dielectric further facilitates the goal of device miniaturization. The presence of the dielectric reduces the overall volume fraction of the switchable chalcogenide material in the operable region between the electrodes as well as the area of contact of the switchable chalcogenide material with the electrodes at the interface between the electrodes and operable region of the device. Since it is unnecessary to supply current to the dielectric component, it becomes possible to reduce the effective dimensions of the device electrodes. In principle, the dimensions of the device electrode need only coincide with the area of contact of the switchable chalcogenide material at the interface. Because of the high stability and resistivity of the dielectric surrounding the switchable chalcogenide material, the lateral dimensions of the dielectric component can also be reduced without compromising performance and an overall reduction in the size of the device is achieved. Further advantages are described in connection with the examples presented hereinbelow.

The composite switching material typically consists of a switchable chalcogenide component and a non-switchable dielectric component mixed together. The chalcogenide component may be in one single phase, generally amorphous. Particularly, the composite switching device may be a two-terminal device which switches from a high-resistance condition to a low-resistance condition when a voltage applied thereacross or the current therethrough exceeds a threshold value $V_{th}$ at $I_{th}$ (for example, about 3 V and about 1 µa), and reverts to the high-resistance condition when a current flowing therethrough falls below a minimum holding value $I_h$ (for example, a few microamperes or less).

Figure 1:
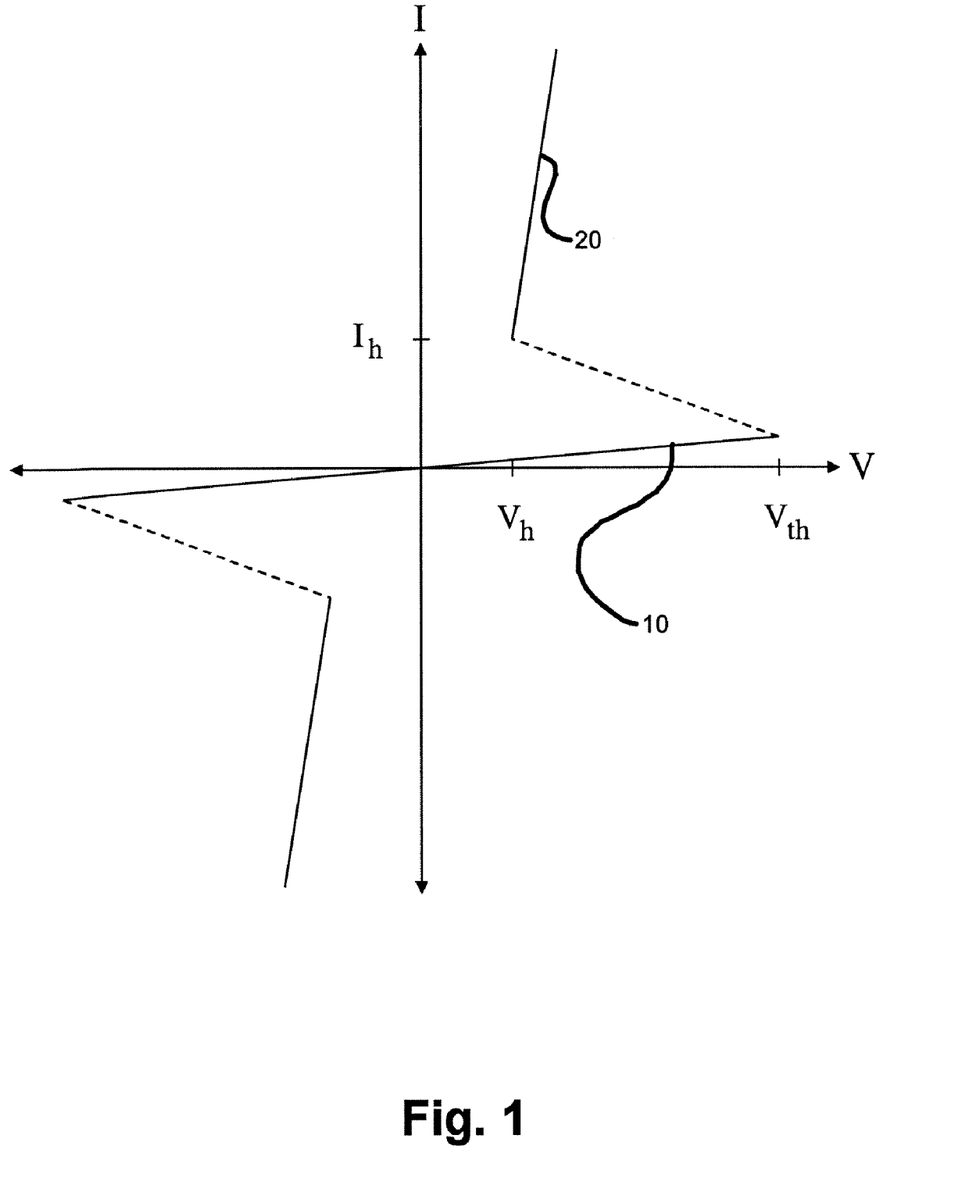
FIG. 1 is a schematic I-V characteristic of a chalcogenide material exhibiting an electrical switching transformation.

The electrical switching and current characteristics of a chalcogenide switching material according to one embodiment of the instant devices are schematically illustrated in FIG. 1, which shows the I-V (current-voltage) characteristics of a chalcogenide switching material. The I-V characteristics depicted in FIG. 1 may be conveniently described by considering a simple two-terminal device configuration in which two spacedly disposed electrodes are in contact with a chalcogenide material and the current I corresponds to the current passing between the two electrodes. The I-V curve of FIG. 1 shows the current passing through a chalcogenide switching material as a function of the voltage applied across the material by the electrodes. The I-V characteristics of the material are generally or approximately symmetric with respect to the polarity of the applied voltage. For convenience, we consider the first quadrant of the I-V plot of FIG. 1 (the portion in which current and voltage are both positive) in the brief discussion of chalcogenide switching behavior that follows. An analogous description that accounts for polarity applies to the third quadrant of the I-V plot.

The I-V curve of a chalcogenide switching material includes a resistive branch 10 and a conductive branch 20 as shown in FIG. 1. Resistive branch 10 corresponds to a branch in which the current passing through the material increases only slightly upon increasing the voltage applied across the material. Resistive branch 10 exhibits a small slope in the I-V plot and appears as a more nearly horizontal line in the first and third quadrants of FIG. 1. Conductive branch 20 corresponds to a branch in which the current passing through the material increases significantly upon increasing the voltage applied across the material. Conductive branch 20 exhibits a large slope in the I-V plot and appears as a more nearly vertical line in the first and third quadrants of FIG. 1. The particular slopes of the resistive branch 10 and conductive branch 20 shown in FIG. 1 are illustrative and not intended to be limiting, the actual slopes will depend on the chemical composition, thickness etc. of the chalcogenide material as well as on parameters such as the resistance, capacitance etc. of surrounding circuit elements. Regardless of the actual slopes, conductive branch 20 necessarily exhibits a larger (steeper) slope than resistive branch 10. When device conditions are such that the chalcogenide material is described by a point on resistive branch 10 of the I-V curve, the chalcogenide material or device may be said to be in a resistive state. When device conditions are such that the chalcogenide material is described by a point on conductive branch 20 of the I-V curve, the chalcogenide material or device may be said to be in a conductive state.

The capacity of a chalcogenide material in accordance with the instant invention to carry a current can be described by reference to FIG. 1. We initially consider a two-terminal device configuration in which no voltage difference is present between the terminals. When no voltage is applied across the chalcogenide material, the material is in a resistive state and no current flows. This condition corresponds to the origin of the I-V plot shown in FIG. 1. The chalcogenide remains in a resistive state as the applied voltage is increased, up to a threshold voltage (labeled $V_{th}$ in the first quadrant of FIG. 1). The slope of the I-V curve for applied voltages between 0 and $V_{th}$ is small in magnitude and indicates that the chalcogenide material has a high electrical resistance, a circumstance reflected in the terminology "resistive branch" used to describe this portion of the I-V curve. The high resistance implies low electrical conductivity and as a result, the current flowing through the material increases only weakly as the applied voltage is increased.

When the applied voltage equals or exceeds the threshold voltage, the chalcogenide material switches from resistive branch 10 to conductive branch 20 of the I-V curve. The switching event occurs almost instantaneously and is depicted by the dashed line in FIG. 1. Upon switching, the device voltage decreases significantly and the device current becomes much more sensitive to changes in the device voltage. The chalcogenide material remains in conductive branch 20 as long as a minimum current, labeled $I_h$ in FIG. 1, is maintained. We refer to $I_h$ as the holding current and the associated voltage $V_h$ as the holding voltage of the device. If the device conditions are changed so that the current becomes less than $I_h$, the material normally returns to resistive branch 10 of the I-V plot and requires re-application of a threshold voltage to resume operation on conductive branch 20. If the current is only momentarily (e.g. a time less than the recovery time of the chalcogenide material) reduced below $I_h$, the conductive state of the chalcogenide may be recovered upon restoring the current to or above $I_h$. Analogous switching behavior occurs in the third quadrant of the I-V plot shown in FIG. 1.

The switching effect of the instant devices originates from a transformation of the chalcogenide material from a resistive state to a conductive state upon application of a threshold voltage, $V_{th}$. A model can be used to describe the phenomenon underlying the switching transformation. According to the model, application of the threshold voltage causes the formation of a conductive channel or filament within the chalcogenide material. In a typical device configuration, a voltage difference is applied across two terminals (electrodes) in electrical communication with a chalcogenide material and a conductive filament forms within the chalcogenide material between the two terminals. At the threshold voltage, the electric field experienced by portions of the chalcogenide material may be sufficiently high to induce a breakdown or avalanche effect whereby electrons are removed from atoms to form a highly conductive, plasma-like filament of charge carriers. Rather than being bound to atoms in bonds or lone pair orbitals, some electrons become unbound and highly mobile. As a result, a conductive channel or filament forms. The conductive filament constitutes a conductive portion or volume within the otherwise resistive chalcogenide material. The conductive filament extends through the chalcogenide material between the device terminals across which the threshold voltage is applied and provides a low resistance pathway for electrical current between those terminals. Portions of the chalcogenide material outside of the filament remain resistive. Since electric current traverses the path of least resistance, the presence of a conductive filament renders the chalcogenide material conductive and establishes a conductive state.

The conductive filament is maintained between the device terminals as long as the device current remains at or above the holding current. A conductive filament is present for all points along conductive branch 20, but the cross sectional area of the filament differs for different points along conductive branch 20. The cross sectional area of the filament refers to directions lateral to the direction of current flow. Depending on operating conditions within conductive branch 20, the filament can be narrow or wide. As the applied voltage is increased along conductive branch 20, the cross section of the filament is enlarged as the applied current is increased. The enlarged filament indicates a greater portion or volume of the chalcogenide material is in a conductive state and exhibits high conductivity. As a result, the chalcogenide material can support a greater current, as indicated by conductive branch 20 of the I-V curve, which shows an increase in the device current as the voltage difference applied across the terminals increases. Variations of the voltage applied to a chalcogenide material operating in conductive branch 20 modify the width or thickness of the filament in directions lateral to the direction of current flow. As a result, the cross-sectional area of chalcogenide material in a conductive state and current carrying capacity of a chalcogenide material increase with increasing voltage along conductive branch 20.

The composite switching device thus has distinct operating regimes having high and low resistance demarcated by the threshold voltage $V_{th}$. The composite switching device conducts a low current in the unswitched high resistance regime that occurs before the device is subjected to the threshold voltage $V_{th}$. In the switched, low resistance state, the device conducts a current at or above the holding current $I_h$ while being maintained at a voltage at or above the holding voltage $V_h$. The holding voltage $V_h$ is lower than the threshold voltage $V_{th}$ (for example, about 0.5 V). When the composite device switches from the high-resistance condition to the low-resistance condition, a voltage across the composite device then may snap back from $V_{th}$ to a lower voltage, $V_h + I \times R(dV/dI)$, where $R(dV/dI)$ is the dynamic resistance of the composite device after switching (triggering on).

In general, chalcogen-based devices, such as described herein, exhibit switching into an ON state (e.g., a low resistance state) when a threshold voltage is exceeded. When the voltage is removed, the device current falls below the holding current and the device switches to an OFF state (e.g. a higher resistance state than the ON state). The switching event relies on formation of a filament through the composite chalcogenide material, in the embodiments described herein as a chalcogenide material, to carry current from one electrode to another. However, minor variations in switching voltage and current may be experienced because a filament formed during a switching operation may take a different path through the composite chalcogenide material as described hereinabove with each occurrence of a switching event because the composite chalcogenide material is not precisely controllable to the atomic level with each ON/OFF switching event.

Examples of chalcogenide materials are found in commonly assigned U.S. Pat. No. 5,166,758, U.S. Pat. No. 5,296,716, U.S. Pat. No. 5,534,711, U.S. Pat. No. 5,536,947, U.S. Pat. No. 5,543,737, U.S. Pat. No. 5,596,522, U.S. Pat. No. 5,687,112, U.S. Pat. No. 5,694,146, U.S. Pat. No. 5,757,446, and U.S. Pat. No. 6,967,344. The disclosures of U.S. Pat. Nos. 5,166,758, 5,296,716, 5,534,711, 5,536,947, 5,543,737, 5,596,522, 5,687,112, 5,694,146, 5,757,446, and 6,967,344 are incorporated by reference herein.

Figure 2:
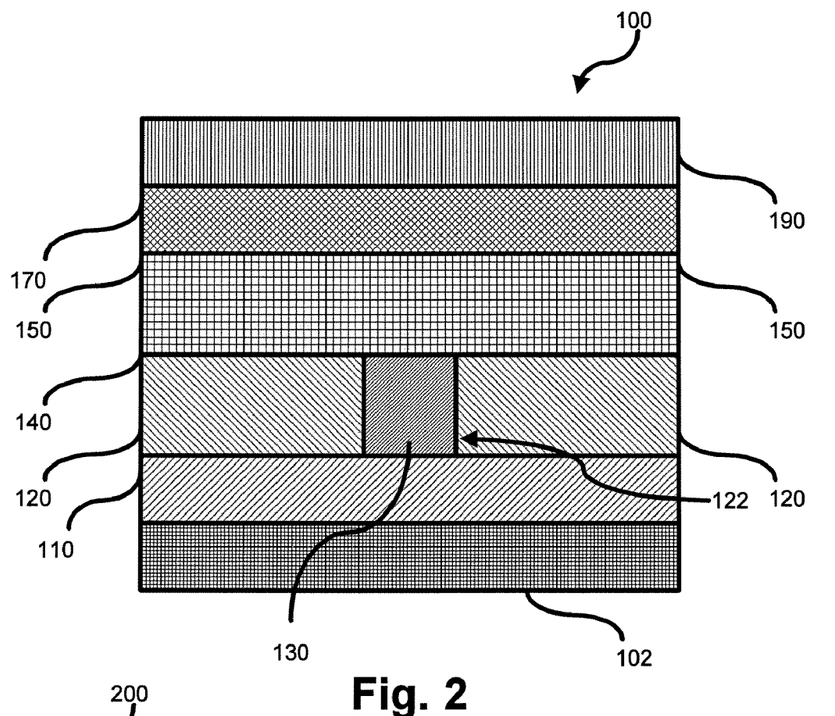
FIG. 2 is a cross-sectional view of a composite chalcogenide device.

FIG. 2 is a cross-sectional view of a composite chalcogenide switching device 100. A lower isolation layer 102 carries composite chalcogenide switching device 100. Lower isolation layer 102 is generally a dielectric and may be, for example, a layer of silicon dioxide ($SiO_2$) (present as a grown oxide on an underlying silicon-based substrate or $SiO_2$ formed from TEOS (tetraethoxysilane)), other oxides, $Si_3N_4$, or other nitrides. The lower isolation layer is typically supported by an underlying substrate or wafer that may include peripheral circuitry such as transistors, diodes, power supplies etc. A lower electrode 110 carries current to a $2^{nd}$ lower electrode 130. A lower insulator 120 surrounds the $2^{nd}$ lower electrode 130 and provides electrical and thermal insulation to a composite chalcogenide switching layer 150 from lower electrode 110. A hole 122 through lower insulator 120 holds the $2^{nd}$ lower electrode 130. An upper electrode 170 is in electrical communication with composite chalcogenide switching layer 150. A capping insulator 190 insulates composite chalcogenide switching device 100 from other circuitry.

Lower electrode 110 and upper electrode 170 are preferably metal, each of which may be further connected to external circuits. Because composite chalcogenide device 100 is typically constructed between various layers of an integrated circuit, insulative structures are provided for isolation of composite chalcogenide device 100. Electrical isolation is provided for the efficient operation of composite chalcogenide device 100 so that electric current leakage is reduced and undesired interactions with adjacent circuitry or neighboring composite chalcogenide devices are minimized or avoided.

Capping insulator 190 provides thermal and electrical insulation of upper electrode 170 and composite chalcogenide layer 150 from adjacent circuits and structures (not shown). Similarly, lower isolation layer 102 provides thermal and electrical insulation of lower electrode 110 from adjacent structures. Within composite chalcogenide device 100, lower insulator 120 provides thermal and electrical insulation of composite chalcogenide layer 150 from lower electrode 110 except at the $2^{nd}$ lower electrode 130, which delivers current to the chalcogenide. The volume of composite chalcogenide layer 150 generally between the $2^{nd}$ lower electrode 130 and upper electrode 170 defines the active region of the device.

Lower isolation layer 102 and capping insulator 190 generally allow composite chalcogenide device 100 to be located adjacent to semiconductor regions or metallization and/or interconnect layers. Such an arrangement facilitates the placement of composite chalcogenide device 100 within the strata of any type of mass-produced layered devices.

Figure 3:
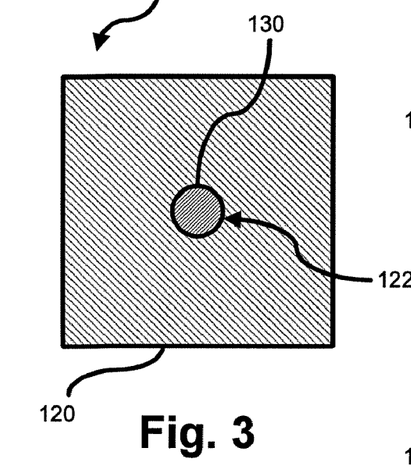
FIG. 3 is a plan-view of a $2^{nd}$ lower electrode of FIG. 2.

FIG. 3 is a plan-view of a the $2^{nd}$ lower electrode layer 130 of FIG. 2. Hole 122 is formed through lower insulator 120 and the $2^{nd}$ lower electrode 130 is formed by deposition and subsequent CMP therein. The $2^{nd}$ lower electrode layer 130 is a generally a planer layer that contacts composite chalcogenide layer 150. Current passes thought the $2^{nd}$ lower electrode to the composite chalcogenide layer.

Figure 4:
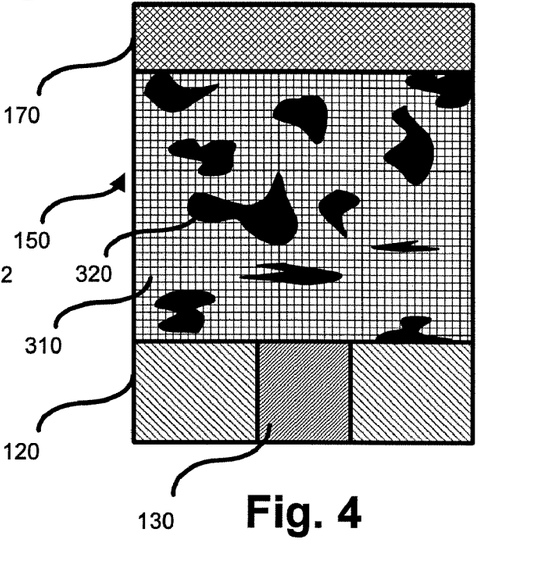
FIG. 4 is a cross-sectional view of a composite chalcogenide layer for use with the composite chalcogenide device of FIG. 2.

FIG. 4 is a cross-sectional view of a composite chalcogenide layer 150 for use with composite chalcogenide device 100 of FIG. 2. In detail, composite chalcogenide layer 150 has a chalcogenide material 310 and a dielectric material 320 interspersed therein. Dielectric material 320 is typically sputtered or co-sputtered onto the $2^{nd}$ lower electrode layer 130 (shown in FIG. 3) along with chalcogenide material 310 to provide a composite layer. For clarity, dielectric material 320 is shown having exaggerated particle size (see contrasting particle sizes of FIGS. 6A-7B). In an embodiment, composite chalcogenide layer 150 is a heterogeneous mixture of a chalcogenide switching material or Ovonic threshold switching alloy and a dielectric material.

Composite chalcogenide layer 150 is provided as a layer of chalcogenide interspersed with dielectric material 320 and is in electrical communication and thermal communication with the $2^{nd}$ lower electrode 130. Composite chalcogenide layer 150 may be, in an example, a $Te_{28}As_{42}Ge_{30}$ chalcogenide alloy having silicon dioxide ($SiO_2$) as dielectric material 320. Composite chalcogenide layer 150, in an example, includes at least one chalcogenide element selected from Te and Se, and may further include one element selected from the group consisting of Ge, Sb, Bi, Pb, Sn, As, Si, P, O, N, In and mixtures thereof. Suitable chalcogenide switching materials include, but are not limited to $As_2Se_3$ and other As—Se binary compositions; $As_2Te_3$ and other As—Te binary compositions; $As_{28}Se_{42}Ge_{30}$ and other As—Se—Ge ternary compositions; $As_{32}Te_{36}Ge_6Si_{26}$, $As_{35}Te_{40}Ge_7Si_{18}$, and other As—Te—Ge—Si quaternary compositions, $As_{31.75}Te_{36}Ge_6Si_{26}In_{0.25}$, $As_{35}Te_{40}Ge_{6.75}Si_{18}In_{0.25}$ and other As—Te—Ge—Si quaternary compositions containing In.

In composite switching devices such as those described herein, electrodes deliver an electric current to the composite chalcogenide or other switching material. As the electric current passes through a composite chalcogenide material, at least a portion of the electric energy of the electrons is transferred to the surrounding material as heat. A portion of the electrical energy of the current flowing through the composite chalcogenide material is converted to heat energy via Joule heating. The amount of electrical energy converted to heat energy increases with the resistivity of the electrical contact, the resistivity of the composite chalcogenide material and the current density (i.e., current divided by area) passing through the switching device.

As discussed, composite chalcogenide layer 150 is a mixture of a chalcogenide material, such as those described above, and a dielectric material. Generally, dielectric materials are materials which are electrical insulators or in which an electric field can be sustained with a minimum dissipation of power. A solid is a dielectric if its valence band is full and is separated from the conduction band by at least 3 eV." McGraw-Hill Encyclopedia of Physics, Second Edition, 1993, page 283. The dielectric materials used herein can be any dielectric material that is chemically non-reactive with the chalcogenide material. Preferably, the dielectric material has a melting point higher than that of the chalcogenide material.

In particular, the dielectric material may be one or more materials selected from the group consisting of oxides, nitrides, fluorides, sulfides, chlorides, carbides, oxynitrides, carboxynitrides, borides, phosphides and mixtures or alloys thereof. Other dielectric materials known in the art may also be used. The dielectric material may also be chosen from the group of organic dielectric materials. These include, but are not limited to, materials such as amides, polyamides, imides, polyimides, parylenes and other high melting oligomeric or polymeric organic substances.

Oxides include silicon oxides such as $SiO_2$, titanium oxides such as $TiO_2$, aluminum oxides such as $Al_2O_3$, zirconium oxides such as $ZrO_2$, germanium oxides such as $GeO_2$, and tantalum oxides such as $Ta_2O_5$. Other possible oxides include $B_2O_3$, $Sb_2O_3$, PbO, and transition metal oxides. Suitable oxides include solid solutions and oxides including two or more metal atoms in the composition. Nitrides include silicon nitrides such as $Si_3N_4$, aluminum nitrides such as AlN, as well as TiN, SiN, ZrN, BN, CN, and off-stoichiometry silicon nitride $SiN_x$. Sulfides include silicon sulfide such as $SiS_2$, germanium sulfide such as $GeS_2$, and zinc sulfide such as ZnS. Fluorides include $MgF_2$, $CaF_2$, and $LiF_2$. Various glasses may also be used. For instance, LaSiON material containing La, Si, O and N; SiAlON material containing Si, Al, O and N; SiAlON material doped with yttrium; or NdSiON material containing Nd, Si, O and N may be used. Amorphous oxides, such as amorphous $SiO_2$, may also be used as a dielectric in the instant composite switching material.

The composite switching material may be a chalcogenide material including a heterogeneous mixture of active (switchable) chalcogenide material and inactive (non-switchable) dielectric material. One embodiment of such a heterogeneous mixture is that of a multi-layered structure with layers of chalcogenide material intermixed with layers of dielectric material. The thickness of each layer, for example, may be between about 5 Å to about 75 Å. In another example, the thickness of each layer may be between about 10 Å to about 50 Å. Alternatively, the thickness of each layer may be between about 20 Å to about 30 Å. The composite switching material may include a periodic or non-periodic arrangement of dielectric or other non-switchable material dispersed within an active chalcogenide or other switching material. The composite switching material may include a combination of multiple layers, some of which include a dielectric material interspersed within a switchable material and some of which include only a switchable material or only a dielectric material. A dual layer structure, for example, that includes a first layer comprising a heterogeneous combination of a dielectric material and a switchable chalcogenide material and a second layer comprising a switchable or non-switchable chalcogenide material in the absence of a dielectric material is within the scope of the instant invention. A dual layer structure that includes two layers, each of which includes a combination of a dielectric material interspersed with a switchable chalcogenide material, is also within the scope of the instant invention.

The composite chalcogenide material may be made by methods such as sputtering, evaporation, or by chemical vapor deposition (CVD), which may be enhanced by plasma techniques such as RF glow discharge. The composite chalcogenide material may be, in an example, made by RF sputtering. It may be formed by multiple source sputtering techniques that make use of a plurality of targets, usually a target of the chalcogenide material and a target of the dielectric material. With these targets arranged in opposition to a substrate, sputtering may be carried out while the substrate is rotated relative to each target. A target containing both chalcogenide and dielectric materials may be used as well. Substrate heating may be used to control the morphology of the chalcogenide material within the composite chalcogenide material formed.

The percentage by volume of dielectric material within the composite chalcogenide material can be controlled in the manufacturing process. In a first example, the percentage by volume of the inactive dielectric material to active chalcogenide or switching material is between about 5% and 90%. In a second example, the percentage by volume of dielectric material is between about 5% and about 20%. In a third embodiment, the percentage by volume of dielectric material is between about 10% and about 15%.

The composite chalcogenide material may also be formed by a spin coating process. The chalcogenide material may be a heterogeneous mixture of a chalcogenide material and a dielectric such as an organic polymer like a polyamide. The resulting mixture may then be spin coated onto a silicon substrate to form a composite chalcogenide material with the desired properties. A chalcogenide or switching material may be suspended within a solution phase and the resulting suspension spin-coated on a substrate or lower support structure to form a composite material.

Figure 5A:
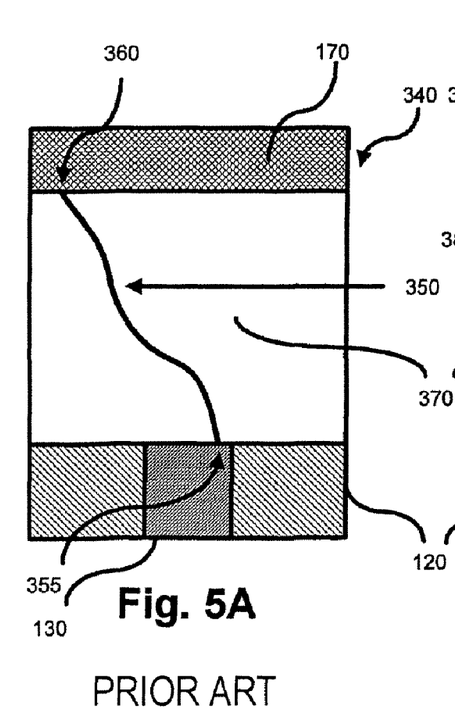
FIG. 5A is a cross-sectional view of the composite chalcogenide device of FIG. 2 having a first filament formed in the composite chalcogenide material having relatively large insulative particles.

FIG. 5A is a cross-sectional view of a prior art chalcogenide device 340 lacking a dielectric component and having a first filament 350 in chalcogenide layer 370. In a first switching event, first filament 350 is formed over a first path between the 2nd lower electrode 130 and upper electrode 170. A first lower contact location 355 is formed at the interface of chalcogenide layer 370 and the 2nd lower electrode 130. A first upper contact location 360 is formed at the interface of chalcogenide layer 370 and upper electrode 170.

Figure 5B:
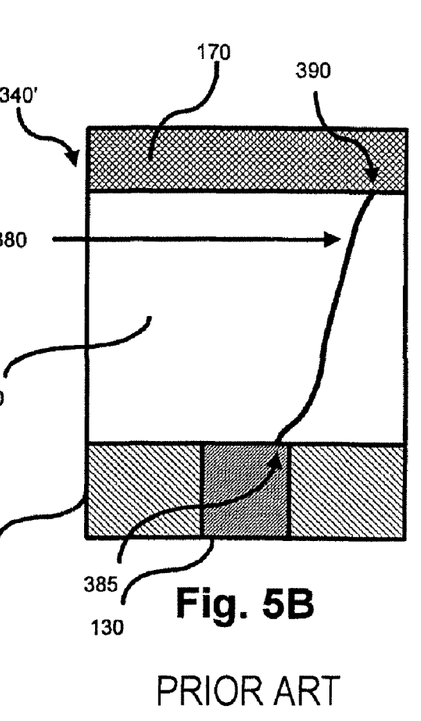
FIG. 5B is a cross-sectional view of the composite chalcogenide device of FIG. 2 having a second filament formed in the composite chalcogenide material having relatively large insulative particles.

FIG. 5B is a cross-sectional view of a prior art chalcogenide device 340 lacking a dielectric component and having a second filament 380 in chalcogenide layer 370. In a second switching event, second filament 380 is formed over a second path between the 2nd lower electrode 130 and upper electrode 170. A second lower contact location 385 is formed at the interface of chalcogenide layer 370 and the 2nd lower electrode 130. A second upper contact location 390 is formed at the interface of chalcogenide layer 370 and upper electrode 170.

Variations in the upper and lower contact locations of the filament and the path over which the filament forms may arise due to variations in several factors, including: the properties of the chalcogenide switching material 370, the properties of the 2nd lower electrode contact 130 or its interface with chalcogenide material 370, the properties of upper contact 170 or its interface with chalcogenide material 370, and/or heat dissipation effects within chalcogenide material 370 or the surrounding structure during cycling, The filament formation process requires application of at least a threshold voltage between the 2nd lower electrode contact 130 and upper contact 170 and is accompanied by heat generation that may lead to expansion or physical displacement of the chalcogenide material. When the composite switching material returns from its conductive state back to its resistive state, the filament collapses and the material cools. The repeated heating and cooling of the material, along with any accompanying thermal and mechanical stresses, may induce variations in the switching properties of the device. Such effects may lead to cycle-to-cycle variations in threshold voltage, threshold current, holding voltage, holding current, path of filament formation, and/or location of the points of contact of the filament with upper and lower electrodes.

Figure 6A:
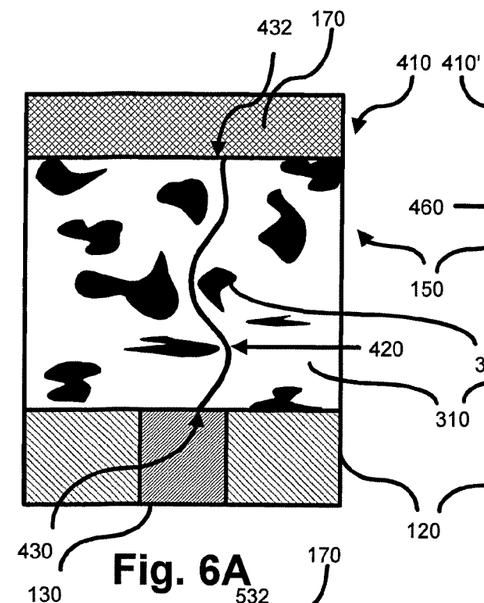
FIG. 6A is a cross-sectional view of the composite chalcogenide device of FIG. 2 having a first filament formed in the composite chalcogenide material having relatively small insulative particles.

FIG. 6A is a cross-sectional view of a composite chalcogenide device 410 having a first filament 420 formed in composite chalcogenide layer 150 having relatively large insulative particles. In a first switching event, first filament 420 is formed. A first lower contact location 430 is formed at the interface of composite chalcogenide layer 150 and the 2nd lower electrode 130. A first upper contact location 432 is formed at the interface of composite chalcogenide layer 150 and upper electrode 170. As shown, first filament 420 takes a path through chalcogenide material 310 and avoids dielectric material 320.

Figure 6B:
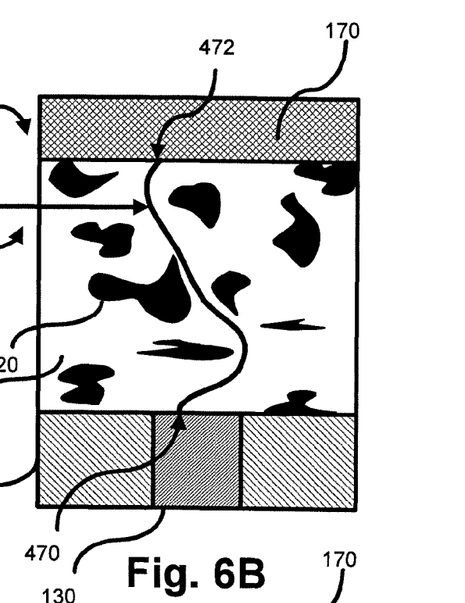
FIG. 6B is a cross-sectional view of the composite chalcogenide device of FIG. 2 having a second filament formed in the composite chalcogenide material having relatively small insulative particles.

FIG. 6B is a cross-sectional view of a composite chalcogenide device 410' having a second filament 460 formed in composite chalcogenide layer 150 having the same relatively large insulative particles as in FIG. 6A. In a second switching event, second filament 460 is formed. A second lower contact location 470 is formed at the interface of composite chalcogenide layer 150 and the 2nd lower electrode 130. A second upper contact location 472 is formed at the interface of composite chalcogenide layer 150 and upper electrode 170.

In comparing FIGS. 6A and 6B, second filament 460 takes a different path than first filament 420 through composite chalcogenide layer 150, but also avoids dielectric material 320. Although first lower contact location 430 and second lower contact location 470 contact the 2nd lower electrode 130 at different locations, the presence of dielectric 320 tends to constrain the variability of the point of contact. Similarly, first upper contact location 432 and second upper contact location 472 contacting upper electrode 170, may occur at different locations, but are also influenced and constrained by the presence of dielectric 320.

Due to the presence of dielectric material 320 in the embodiments shown in FIGS. 6A and 6B, the volume fraction of chalcogenide material 310 is reduced relative to the chalcogenide-only device shown in FIGS. 5A and 5B. The presence of the dielectric 320 acts to confine and channel the filament through the chalcogenide component relative to the chalcogenide-only device and provides for greater reproducibility of switching performance over repeated cycles of operation. Since the filament does not form through the dielectric, the presence of dielectric 320 limits the range of paths over which the filament may form during different cycles of operation.

Figure 7A:
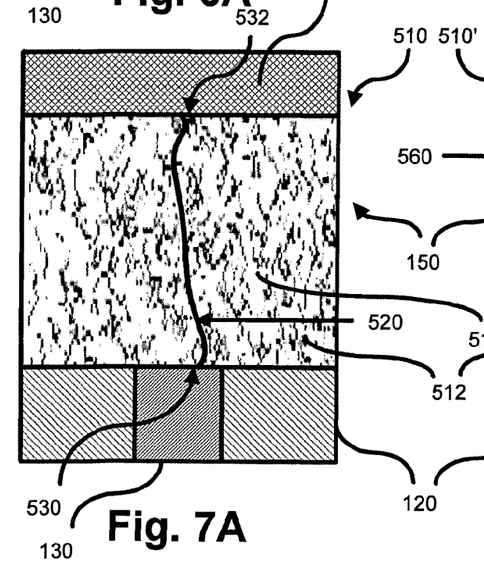
FIG. 7A is a cross-sectional view of the composite chalcogenide device of FIG. 2 having a first filament formed in the composite chalcogenide material having very small insulative particles

FIG. 7A is a cross-sectional view of a composite chalcogenide device 510 of FIG. 2 having a first filament formed in the composite chalcogenide material having relatively smaller insulative particles than the example of FIG. 6A. In the manufacturing process (see FIG. 10), relatively smaller particles of dielectric material 514 may be deposited along with chalcogenide material 512. Here, the fineness of the insulative particles has the effect of improving the homogeneity of composite chalcogenide layer 150. Thus, the operating parameters of composite chalcogenide device 510 may be tuned for a desired performance parameter by adjusting the size of dielectric particles 514 as well as the dielectric material and chalcogenide material. Here, a first filament 520 is formed between a first lower contact location 530 and a first upper contact location 532.

Figure 7B:
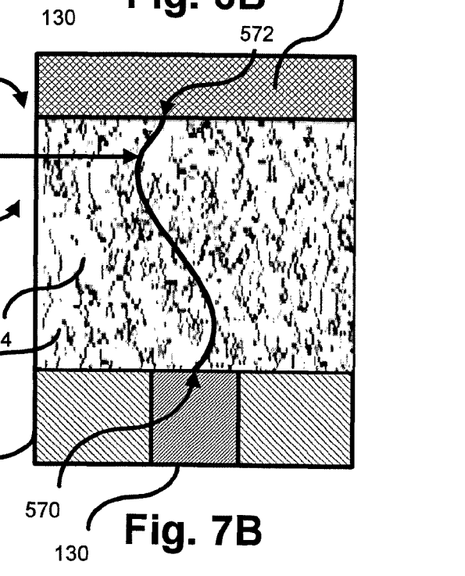
FIG. 7B is a cross-sectional view of the composite chalcogenide device of FIG. 2 having a second filament formed in the composite chalcogenide material having very small insulative particles.

FIG. 7B is a cross-sectional view of a composite chalcogenide device 510' having a second filament formed in the composite chalcogenide material having relatively small insulative particles. Here, a second filament 560 is formed between a second lower contact location 570 and a second upper contact location 572. In comparing FIGS. 7A and 7B, second filament 560 takes a slightly different path than first filament 520 through composite chalcogenide layer 150, but the overall reproducibility of filament formation and switching characteristics is expected to improve relative to the chalcogenide-only device shown in FIGS. 5A and 5B.

Figure 8:
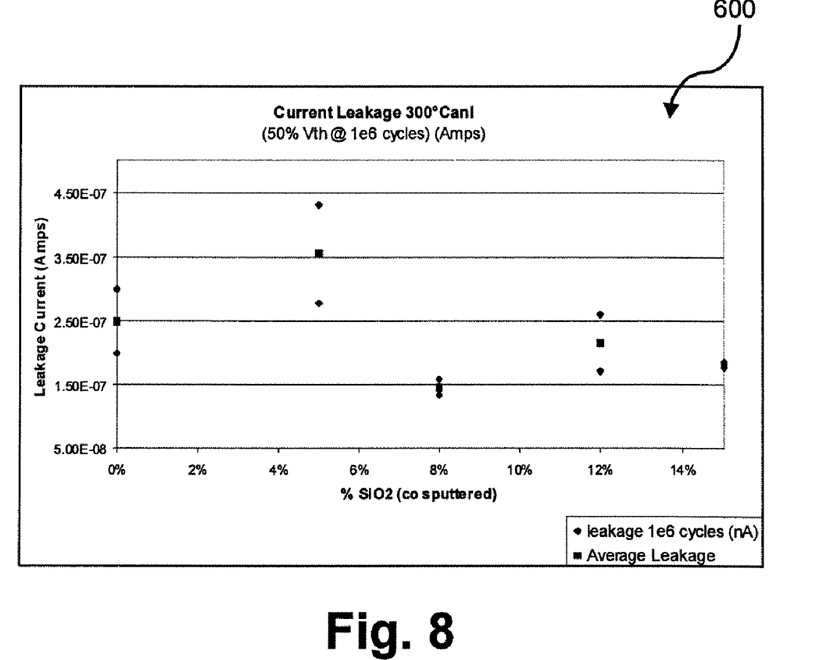
FIG. 8 is a graph describing leakage current for the composite chalcogenide device of FIG. 2.

FIG. 8 is a graph 600 describing leakage current vs. dielectric fraction for the composite chalcogenide device 100 of FIG. 2. In this example, a chalcogenide material ($Te_{42}As_{28}Ge_{30}$) is co-sputtered with silicon dioxide ($SiO_2$) and annealed at 300° C. The data show the leakage current as a function of volume fraction of $SiO_2$ in the composite chalcogenide switching material at a device voltage of approximately half the threshold voltage. Data were taken after $10^6$ cycles. FIG. 8 shows the average leakage current after 1e6 cycles as well as the range of leakage currents obtained on many devices. The data show a generally reduced leakage current with increased addition of $SiO_2$ above a volume fraction of 5% in composite chalcogenide layer 150 (see FIG. 4). Additionally, the variation of leakage current upon cycling decreases as the volume fraction of $SiO_2$ increases.

Figure 9:
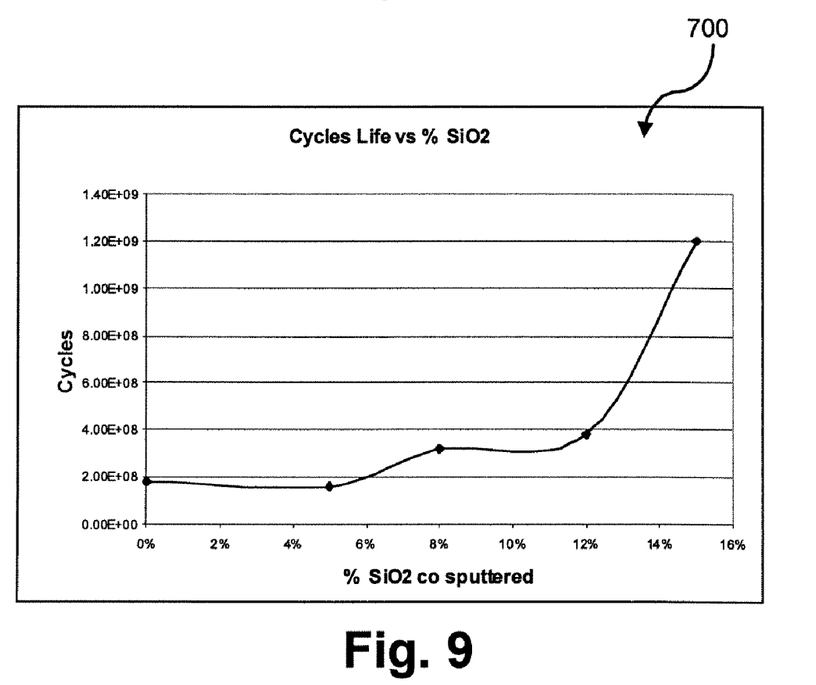
FIG. 9 is a graph describing an example of life cycle for the composite chalcogenide device of FIG. 2.

FIG. 9 is a graph 700 describing an example of life cycle vs. dielectric fraction for composite chalcogenide device 100 of FIG. 2. As shown, the life cycle of composite chalcogenide device 100 increases as the volume fraction of $SiO_2$ in the composite chalcogenide layer 150 is increased.

Figure 10:
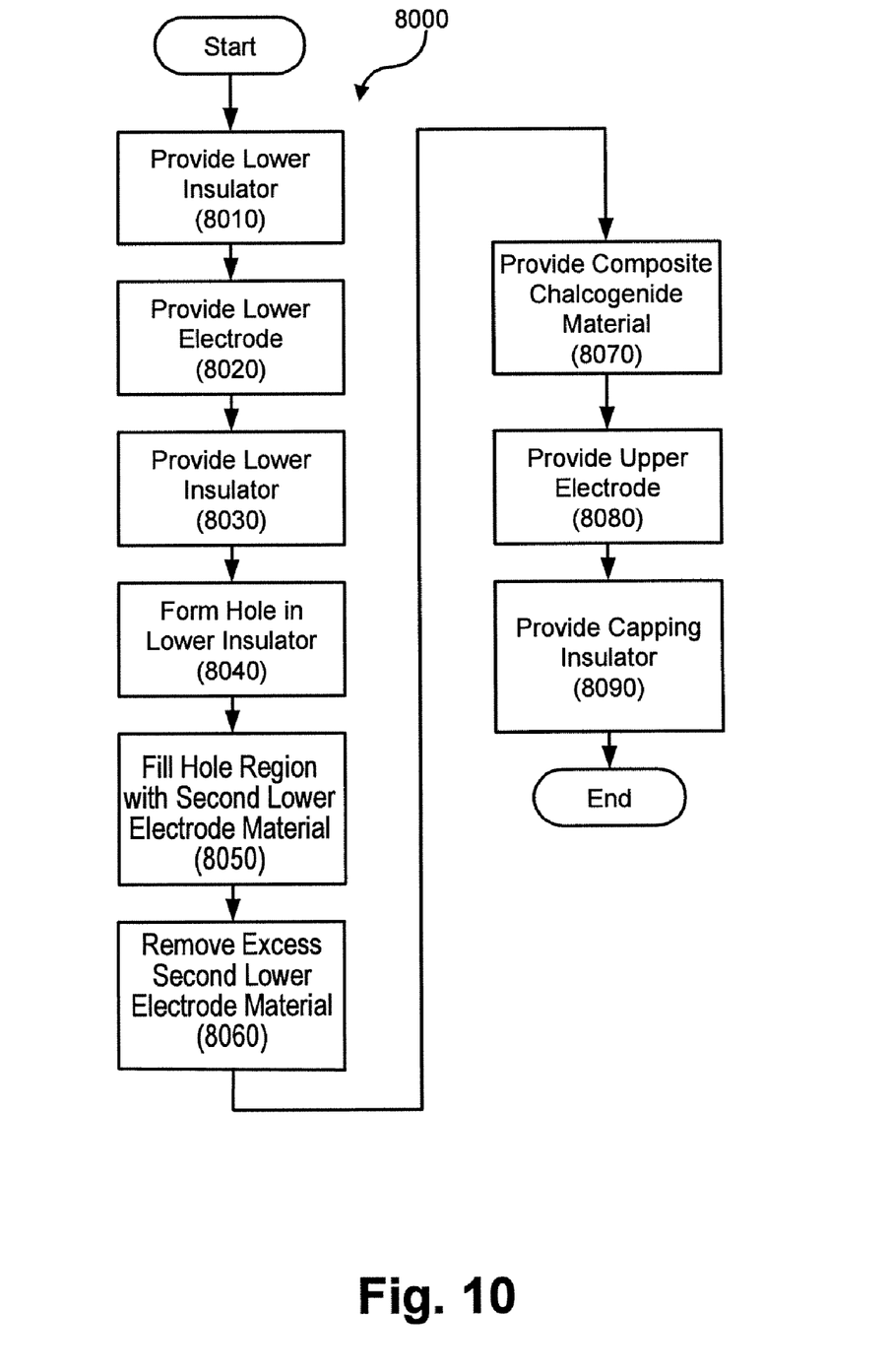
FIG. 10 is a flow diagram of the construction of the composite chalcogenide device of FIG. 2.

FIG. 10 is a flow diagram 8000 of the construction of composite chalcogenide device 100 of FIG. 2. In step 8010, lower isolation layer 102 is provided. Lower isolation layer is typically made of $SiO_2$ (silicon dioxide) and is readily deposited by techniques such as chemical vapor deposition (CVD), plasma enhanced chemical vapor deposition (PECVD), sputtering or spin-casting. $SiO_2$ may also form as a grown oxide on silicon-based substrates. As is known in the art, silicon dioxide is a common insulator in semiconductor device technology. Lower isolation layer 102 provides electrical and thermal isolation from any adjacent structures.

Next, in step 8020 lower electrode 110 is provided. Lower electrode 110 is typically a tungsten (W) layer or refractory metal deposited by sputtering or CVD methods. As composite chalcogenide device 100 may be constructed between steps in a semiconductor process, lower electrode 110 may be deposited along with other interconnect lines for other circuitry under construction.

Next, in step 8030 lower insulator 120 is provided. Lower insulator 120 may also be a silicon dioxide material.

Next, in step 8040 lower insulator 120 is configured to create hole 122. In this step, a hole is etched through lower insulator 120 to expose lower electrode 110 using, e.g., reactive ion etching (RIE) or a chemical etch with appropriate masking techniques such as photolithography.

Next, in step 8050 the 2nd lower electrode 130 is provided. The 2nd lower electrode 130 is preferably a low electrical and low thermal resistance material such as W, TiN, TaN, WN, titanium silicon nitride, tantalum nitride, or other materials. The 2nd lower electrode 130 may be formed by sputtering (PVD), chemical vapor deposition (CVD), plasma enhanced chemical vapor deposition (PECVD), atomic layer deposition (ALD), or other deposition method generally known in the art.

Next, in step 8060, excess the 2nd lower electrode material is removed. The surface is generally planarized using chemical mechanical polishing (CMP) techniques to provide a planer surface for composite chalcogenide layer 150.

Next, in step 8070 composite chalcogenide layer 150 is provided. Co-sputtering of chalcogenide materials with various dielectric materials can be used to reduce the volume fraction of active switching material as described hereinabove. In an embodiment, an OTS composition as described hereinabove is co-sputtered with $SiO_2$ to form composite chalcogenide layer 150. Using co-sputtering composite chalcogenide layer 150 is heterogeneously a mixture of chalcogenide threshold alloy and insulator. Another deposition technique is to use sputtering of a heterogeneous target that contains chalcogenide material and insulator material.

Next, in step 8080 upper electrode 170 is provided. Typically, upper electrode 170 is metallic and is deposited by sputtering or evaporation.

Next, in step 8090 capping insulator 180 is provided for isolation of composite chalcogenide device 100. Capping insulator 180 may comprise a material such as $SiO_2$ or $Si_3N_4$. In a preferred embodiment, silicon dioxide is used.

The present invention has been particularly shown and described with reference to the foregoing embodiments, which are merely illustrative of the best modes for carrying out the invention. It should be understood by those skilled in the art that various alternatives to the embodiments of the invention described herein may be employed in practicing the invention without departing from the spirit and scope of the invention as defined in the following claims. The embodiments should be understood to include all novel and non-obvious combinations of elements described herein, and claims may be presented in this or a later application to any novel and non-obvious combination of these elements. Moreover, the foregoing embodiments are illustrative, and no single feature or element is essential to all possible combinations that may be claimed in this or a later application.

With regard to the processes, methods, heuristics, etc. described herein, it should be understood that although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes described herein are provided for illustrating certain embodiments and should in no way be construed to limit the claimed invention.

Accordingly, it is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In sum, it should be understood that the invention is capable of modification and variation and is limited only by the following claims.

All terms used in the claims are intended to be given their broadest reasonable constructions and their ordinary meanings as understood by those skilled in the art unless an explicit indication to the contrary is made herein. In particular, use of the singular articles such as "a," "the," "said," etc. should be read to recite one or more of the indicated elements unless a claim recites an explicit limitation to the contrary.

What is claimed is:

1. An electrical device comprising:
   a first electrode;
   an insulating layer surrounding said first electrode;
   a second electrode; and
   a composite switching material disposed between said first electrode and said second electrode, said composite switching material including a switchable component and a non-switchable component, said switchable component having a resistive state and a conductive state, said switchable component switching from said resistive state to said conductive state upon application of a voltage between said first electrode and said second electrode.

2. The electrical device of claim 1, wherein said switchable component and said non-switchable component form a heterogeneous layer between said first electrode and said second electrode.

3. The electrical device of claim 1, wherein the volume fraction of said non-switchable component in said composite switching material is between 5 percent and 90 percent.

4. The electrical device of claim 1, wherein the volume fraction of said non-switchable component in said composite switching material is between 5 percent and 20 percent.

5. The electrical device of claim 1, wherein said switchable component comprises a chalcogenide material.

6. The electrical device of claim 5, wherein said chalcogenide material comprises Te or Se.

7. The electrical device of claim 6, wherein said chalcogenide material further comprises Ge and As.

8. The electrical device of claim 1, wherein said non-switchable component comprises a dielectric material.

9. The electrical device of claim 8, wherein said dielectric comprises a material selected from the group consisting of oxides, nitrides, carbides, oxynitrides, and borides.

10. The electrical device of claim 9, wherein said dielectric material comprises silicon.

11. The electrical device of claim 1, wherein said switchable component is in said resistive state when the voltage applied across said first electrode and said second electrode is less than a first voltage.

12. The electrical device of claim 11, wherein said switchable component switches to said conductive state when the voltage applied across said first electrode and said second electrode is equal to or greater than said first voltage, said device conducting at least a first current between said first electrode and said second electrode in said conductive state.

13. The electrical device of claim 12, wherein said switchable component returns to said resistive state when the current passing between said first electrode and said second electrode is less than said first current.

14. The electrical device of claim 1, wherein said conductive state of said switchable component comprises a conductive filament, said conductive filament extending from said first electrode to said second electrode.

15. The electrical device of claim 14, wherein said conductive state of said switchable component comprises a first region and a second region, said first region comprising said conductive filament, said second region comprising said switchable component in said resistive state.

16. The electrical device of claim 1, wherein said insulating layer includes a hole, said first electrode occupying said hole.

17. The electrical device of claim 1, wherein said first electrode contacts said composite switching material.

18. The electrical device of claim 17, wherein said second electrode contacts said composite switching material.

19. The electrical device of claim 18, wherein the area of contact of said first electrode with said composite switching material is less than the area of contact of said second electrode with said composite switching material.

20. The electrical device of claim 2 further comprising a second layer, said second layer disposed between said heterogeneous composite switching layer and said first electrode.

21. The electrical device of claim 20, wherein said second layer comprises a chalcogenide material.

22. The electrical device of claim 21, wherein said second layer further comprises a dielectric material dispersed within said chalcogenide material.

23. The electrical device of claim 21, wherein said chalcogenide material is a switchable chalcogenide material.

* * * * *